(12) United States Patent
Matsumoto et al.

(10) Patent No.: US 10,537,967 B2
(45) Date of Patent: Jan. 21, 2020

(54) LASER PROCESSING METHOD FOR PLATE-SHAPED WORKPIECE

(71) Applicant: DISCO CORPORATION, Tokyo (JP)

(72) Inventors: Hirokazu Matsumoto, Tokyo (JP); Saki Kimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 515 days.

(21) Appl. No.: 14/966,261

(22) Filed: Dec. 11, 2015

(65) Prior Publication Data

US 2016/0184934 A1    Jun. 30, 2016

(30) Foreign Application Priority Data

Dec. 24, 2014 (JP) .................. 2014-259740

(51) Int. Cl.
*B23K 26/38*    (2014.01)

(52) U.S. Cl.
CPC .................. *B23K 26/38* (2013.01)

(58) Field of Classification Search
CPC ...... B23K 26/38; B23K 26/402; B23K 26/70; H01L 21/6836; H01L 21/78; H01L 2221/68327; H01L 2221/68381
USPC ........................................ 438/463
See application file for complete search history.

(56) References Cited

U.S. PATENT DOCUMENTS

| | | | |
|---|---|---|---|
| 4,806,504 A * | 2/1989 | Cleeves | H01L 21/31055 257/E21.245 |
| 7,579,260 B2 * | 8/2009 | Nakamura | H01L 21/67092 257/723 |
| 7,767,556 B2 * | 8/2010 | Okawa | H01L 21/6836 438/463 |

(Continued)

FOREIGN PATENT DOCUMENTS

| | | | |
|---|---|---|---|
| JP | 5347270 | * | 4/1978 |
| JP | 2004-188475 | | 7/2004 |

(Continued)

OTHER PUBLICATIONS

JP translation of JP office action in counterpart dated Jun. 26, 2018 (PDF).*

(Continued)

*Primary Examiner* — Ibrahime A Abraham
*Assistant Examiner* — Frederick F Calvetti
(74) *Attorney, Agent, or Firm* — Greer Burns & Crain, Ltd.

(57) ABSTRACT

A laser processing method includes a supporting step of attaching an adhesive tape to an annular frame having an opening for accommodating the plate-shaped workpiece and attaching the plate-shaped workpiece to the adhesive tape. The adhesive tape is composed of a base film, an adhesive layer formed on one side of the base film, and a functional layer formed on the other side of the base film. The functional layer includes fine particles of metal oxide, emulsion particles of thermoplastic resin as a binder, and a dispersing (Continued)

medium. The laser processing method further includes a laser processed groove forming step of applying a laser beam from a laser beam applying unit to the plate-shaped workpiece held on the chuck table and relatively feeding the chuck table and the laser beam applying unit by operating a feeding unit, thereby forming the laser processed groove on the plate-shaped workpiece.

19 Claims, 5 Drawing Sheets

(56) References Cited

U.S. PATENT DOCUMENTS

| | | | | |
|---|---|---|---|---|
| 7,825,009 | B2* | 11/2010 | Sekiya | H01L 21/6835 257/E21.599 |
| 7,919,395 | B2* | 4/2011 | Morikazu | B28D 5/0011 438/460 |
| 8,783,577 | B2* | 7/2014 | Suzuki | H01L 21/84 235/492 |
| 9,093,518 | B1* | 7/2015 | Lei | H01L 21/6836 |
| 9,130,057 | B1* | 9/2015 | Kumar | H01L 21/67092 |
| 9,142,457 | B2* | 9/2015 | Tanaka | H01L 21/6836 |
| 9,165,832 | B1* | 10/2015 | Papanu | H01L 21/78 |
| 9,349,648 | B2* | 5/2016 | Lei | H01L 21/0337 |
| 9,446,479 | B2* | 9/2016 | Wei | H01L 21/67092 |
| 2004/0112880 | A1* | 6/2004 | Sekiya | B23K 26/032 219/121.69 |
| 2006/0121697 | A1* | 6/2006 | Fujii | B23K 26/0057 438/460 |
| 2008/0169349 | A1* | 7/2008 | Suzuki | H01L 21/84 235/492 |
| 2009/0186216 | A1* | 7/2009 | Inada | H01L 21/67132 428/337 |
| 2010/0081258 | A1* | 4/2010 | Takamoto | H01L 21/6836 438/464 |
| 2011/0210455 | A1* | 9/2011 | Oonishi | C09J 7/00 257/798 |
| 2012/0061805 | A1* | 3/2012 | Amano | C09J 7/0203 257/622 |
| 2012/0126380 | A1* | 5/2012 | Uenda | H01L 21/6836 257/659 |
| 2013/0045585 | A1* | 2/2013 | Inada | H01L 21/67132 438/464 |
| 2013/0087947 | A1* | 4/2013 | Kitahara | H01L 21/78 264/400 |
| 2013/0087948 | A1* | 4/2013 | Kitahara | B23K 26/18 264/400 |
| 2013/0087949 | A1* | 4/2013 | Kitahara | H01L 21/78 264/400 |
| 2013/0330910 | A1* | 12/2013 | Tanaka | H01L 21/6836 438/462 |
| 2014/0038392 | A1* | 2/2014 | Yonehara | H01L 21/304 438/463 |
| 2014/0057100 | A1* | 2/2014 | Amano | H01L 21/78 428/347 |
| 2014/0319684 | A1* | 10/2014 | Suzuki | H01L 21/84 257/746 |
| 2015/0136312 | A1* | 5/2015 | Wei | H01L 21/6835 156/248 |

FOREIGN PATENT DOCUMENTS

| | | | |
|---|---|---|---|
| JP | 2004188475 | * | 7/2004 |
| JP | 2006134971 A | | 5/2006 |
| JP | 2007-019252 | | 1/2007 |
| JP | 2007019252 | * | 1/2007 |
| JP | 2008049346 A | | 3/2008 |
| JP | 2010111829 A | | 5/2010 |

OTHER PUBLICATIONS

Translation JP 2006134971.*
Translation JP 2010111829.*
Translation JP 2008049346.*

* cited by examiner

LASER PROCESSING METHOD FOR PLATE-SHAPED WORKPIECE

BACKGROUND OF THE INVENTION

Field of the Invention

The present invention relates to a laser processing method for dividing a plate-shaped workpiece such as a wafer into chips by applying a laser beam having an absorption wavelength to the plate-shaped workpiece.

Description of the Related Art

In a semiconductor device fabrication process, a plurality of crossing division lines are formed on the front side of a substantially disk-shaped semiconductor wafer to thereby define a plurality of separate regions, and a plurality of devices such as ICs and LSIs are formed in the respective separate regions. The semiconductor wafer is cut along the division lines to thereby produce a plurality of individual device chips, which are widely used in various electronic equipment such as mobile phones and personal computers.

Further, also in the case of an optical device wafer having a substrate such as a sapphire substrate and a silicon carbide substrate and a gallium nitride compound semiconductor layer formed on the front side of the substrate, the optical device wafer is cut along the division lines to obtain individual optical device chips such as light emitting diodes (LEDs) and laser diodes (LDs), which are used in various electrical equipment such as illumination equipment, backlight of LCD, and signal light.

As a method of dividing a wafer along the division lines, there has been proposed a method including the steps of applying a pulsed laser beam having an absorption wavelength to the wafer along each division line to thereby form a laser processed groove as a break start point along each division line, and next applying an external force to the wafer along each division line where the laser processed groove is formed, thereby breaking the wafer along each division line (see Japanese Patent Laid-open Nos. 2004-188475 and 2007-019252, for example). In applying the pulsed laser beam having an absorption wavelength to the wafer along each division line, the wafer is preliminarily attached to an adhesive tape supported to an annular frame, wherein the adhesive tape is composed of a base film of polyvinyl chloride and an adhesive layer of acrylic resin formed on the front side of the base film, so as to keep the divided individual device chips in position.

SUMMARY OF THE INVENTION

However, in the case that the wafer is completely divided by applying the laser beam along each division line, there is a problem such that the adhesive tape may be melted by the heat due to the application of the laser beam, causing adhering of the adhesive tape to a chuck table.

It is therefore an object of the present invention to provide a laser processing method for completely dividing a wafer by applying a laser beam having an absorption wavelength to the wafer along each division line, wherein melting of the adhesive tape due to the application of the laser beam can be suppressed to thereby prevent adhering of the adhesive tape to the chuck table.

In accordance with an aspect of the present invention, there is provided a laser processing method for forming a laser processed groove on a plate-shaped workpiece by using a laser processing apparatus including a chuck table for holding the plate-shaped workpiece, laser beam applying means for applying a laser beam to the plate-shaped workpiece held on the chuck table, and feeding means for relatively feeding the chuck table and the laser beam applying means, the laser processing method including: a supporting step of attaching an adhesive tape to an annular frame having an opening for accommodating the plate-shaped workpiece and attaching the plate-shaped workpiece to the adhesive tape in the condition where the plate-shaped workpiece is positioned in the opening of the annular frame, thereby supporting the plate-shaped workpiece through the adhesive tape to the annular frame, the adhesive tape being composed of a base film, an adhesive layer formed on one side of the base film, and a functional layer formed on the other side of the base film, the functional layer including fine particles of metal oxide, emulsion particles of thermoplastic resin as a binder, and a dispersing medium; a holding step of holding the plate-shaped workpiece on the chuck table in the condition where the functional layer of the adhesive tape attached to the plate-shaped workpiece is in contact with the chuck table, after performing the supporting step; and a laser processed groove forming step of applying the laser beam from the laser beam applying means to the plate-shaped workpiece held on the chuck table and relatively feeding the chuck table and the laser beam applying means by operating the feeding means, after performing the holding step, thereby forming the laser processed groove on the plate-shaped workpiece.

Preferably, the laser beam to be applied from the laser beam applying means has a wavelength of 300 to 400 nm. Preferably, the laser processed groove has a depth reaching the adhesive tape.

In the laser processing method according to the present invention, the adhesive tape is composed of the base film, the adhesive layer formed on one side of the base film, and the functional layer formed on the other side of the base film, the functional layer including the fine particles of metal oxide, the emulsion particles of thermoplastic resin as a binder, and the dispersing medium. In performing the laser processing, the plate-shaped workpiece is attached to the adhesive tape and the plate-shaped workpiece is held on the chuck table in the condition where the functional layer of the adhesive tape is in contact with the chuck table. Accordingly, even when the laser beam is applied to the adhesive tape, melting of the adhesive tape can be suppressed by the functional layer, so that adhering of the adhesive tape to the chuck table can be prevented.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
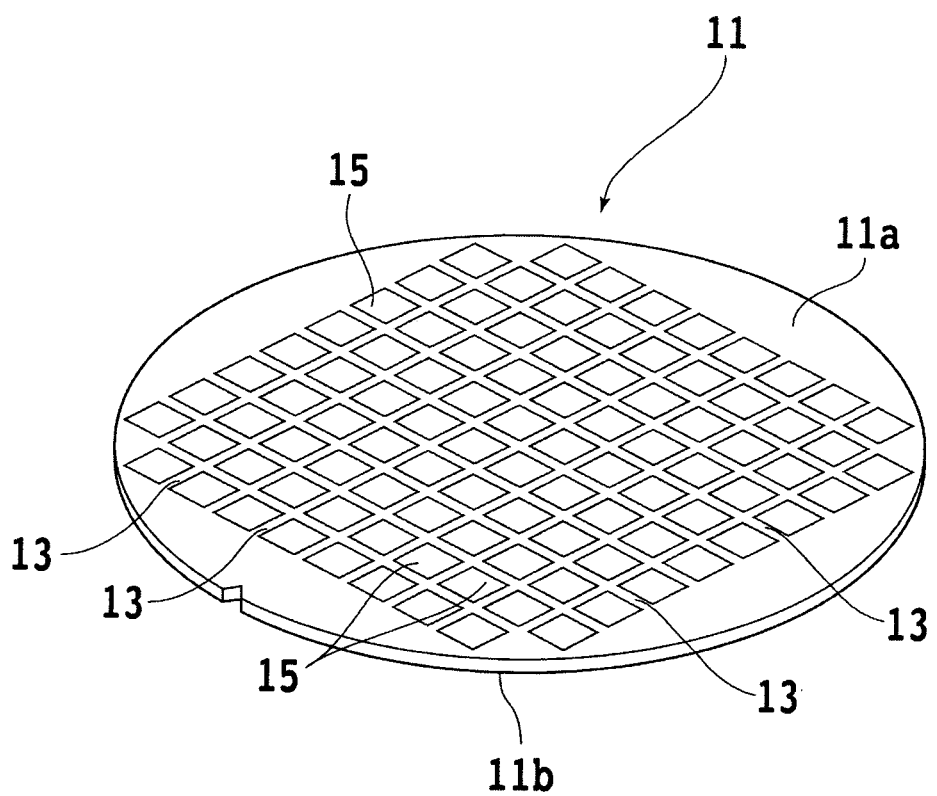
FIG. 1 is a perspective view of a semiconductor wafer as viewed from the front side thereof.

A preferred embodiment of the present invention will now be described in detail with reference to the drawings. Referring to FIG. 1, there is shown a perspective view of a semiconductor wafer (which will be hereinafter referred to also simply as wafer) 11 as a kind of plate-shaped workpiece as viewed from the front side thereof. As shown in FIG. 1, the wafer 11 has a front side 11a and a back side 11b. A plurality of crossing division lines (streets) 13 are formed on the front side 11a of the wafer 11 to thereby define a plurality of separate regions where a plurality of devices 15 such as ICs and LSIs are formed. The plate-shaped workpiece to be processed by the laser processing method of the present invention is not limited to the semiconductor wafer 11, but may be various other kinds of plate-shaped workpieces such as an optical device wafer, glass plate, and ceramic substrate.

Figure 2:
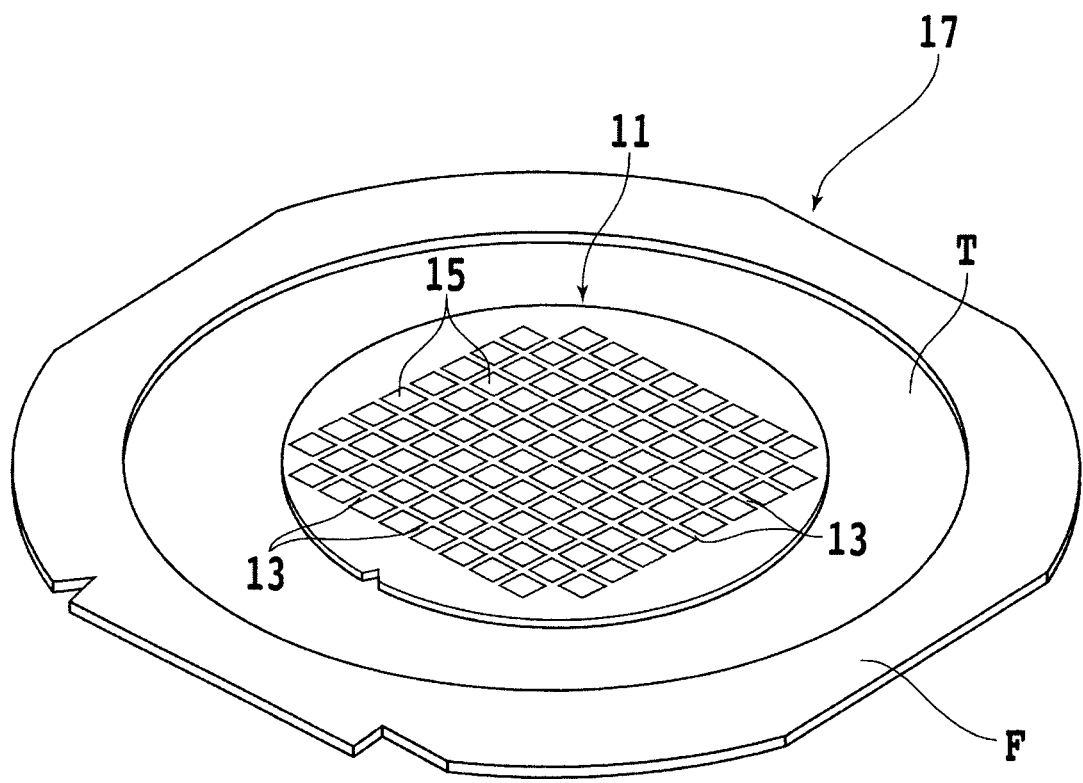
FIG. 2 is a perspective view of a wafer unit formed by supporting the semiconductor wafer through an adhesive tape to an annular frame.
Figure 3:
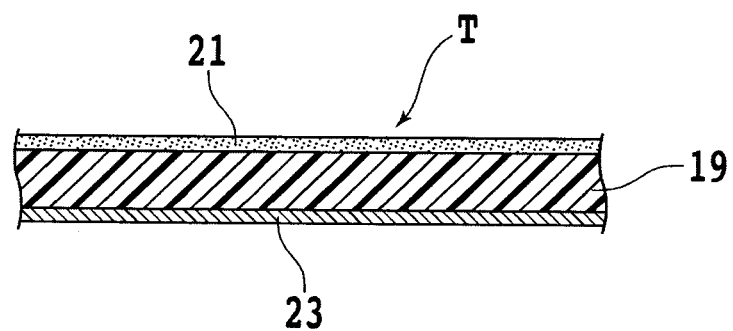
FIG. 3 is an enlarged sectional view of the adhesive tape.

In performing the laser processing method of the present invention, the back side 11b of the wafer 11 is attached to an adhesive tape T whose peripheral portion is attached to an annular frame F, thereby forming a wafer unit 17 as shown in FIG. 2. This wafer unit 17 is to be loaded into a laser processing apparatus. As shown in FIG. 3, the adhesive tape T is composed of a base film 19, an adhesive layer 21 formed on one side of the base film 19, and a functional layer 23 formed on the other side of the base film 19. The functional layer 23 includes fine particles of metal oxide, emulsion particles of thermoplastic resin as a binder, and a dispersing medium.

The configuration of the adhesive tape T to be used in the laser processing method of the present embodiment will now be described in more detail. In the following description, the symbols in the base film 19, the adhesive layer 21, and the functional layer 23 will be omitted.

(Functional Layer of the Adhesive Tape)

The functional layer formed on the back side of the base film is a layer not melted or resistant to melting by the application of laser light, and this layer functions to protect the back side of the base film so as to prevent adhering of the base film to a chuck table or the like due to melting of the base film. The functional layer can be formed on the back side of the base film by applying a specific coating material and then drying it. By using the specific coating material to form the functional layer on the back side of the base film, it is possible to prevent the possibility that the base film may adhere to a chuck table or the like due to melting at a position where the energy of laser light is concentrated. The coating material to be used for the formation of the functional layer contains fine particles of metal oxide, emulsion particles of thermoplastic resin as a binder, and a dispersing medium.

<Fine Particles of Metal Oxide>

Examples of the fine particles of metal oxide include fine particles of silicon oxide, tin oxide, aluminum oxide, and zirconium oxide. More specifically, examples of these fine particles include colloidal silica, colloidal alumina, zirconium oxide/silica composite sol, tin oxide/silica composite sol, zinc antimonate sol, phosphorus doped tin oxide water-dispersed sol, and minute colloidal zirconia aqueous sol. Of these materials, colloidal silica is preferably used. In particular, colloidal silica surface-treated with aluminum is preferably used. As the shape of colloidal silica, a spherical shape is preferably used.

As the size of the fine particles of metal oxide, the average particle size of primary particles before aggregation must be set to a value greater than or equal to 5 nm, preferably 10 nm and less than or equal to 400 nm, preferably 250 nm, more preferably 150 nm, further more preferably 100 nm, most preferably 50 nm. If the average particle size of the primary particles constituting the fine particles of metal oxide is less than 5 nm or greater than 400 nm, adhering of the base film to a chuck table or the like due to melting cannot be prevented by the coating film (functional layer) formed on the back side of the base film at a position where the energy of laser light is concentrated.

The reason why the average particle size of the primary particles constituting the fine particles of metal oxide has an effect on melting of the base film at a position where the energy of laser light is concentrated is not always apparent. However, when the average particle size of the primary particles constituting the fine particles of metal oxide is small, the laser light is scattered or absorbed by the fine particles of metal oxide, causing a reduction in intensity of the laser light. When the intensity of the laser light is reduced, it is considered that melting of the resin contained in the functional layer may be suppressed to result in resistance of the functional layer to melting.

<Thermoplastic Resin>

Examples of the thermoplastic resin include polyolefin resin, polyamide resin, and polyester resin (e.g., PET). These resins may be used solely or in combination. The polyolefin resin is not especially limited, but various polyolefins may be used. Examples of the polyolefin resin include ethylene homopolymer, propylene homopolymer, ethylene-propylene copolymer, ethylene-α-olefin copolymer, and propylene-α-olefin copolymer. The α-olefin mentioned above represents unsaturated hydrocarbon compounds usually containing 3 to 20 carbon atoms. Examples of the α-olefin include propylene, 1-butene, 1-pentene, 1-hexene, 1-heptene, 3-methyl-1-butene, and 4-methyl-1-pentene.

The polyamide resin is a chain polymer formed by polymerizing a plurality of monomers through amide bonds (—NH—CO—). Examples of the monomer constituting the polyamide resin include amino acid such as aminocaproic acid, aminoundecanoic acid, aminododecanoic acid, and paraaminomethyl benzoic acid and also include lactam such as ε-caprolactam, undecanolactam, and ω-lauryllactam. These monomers may be used solely or in combination.

The binder (the thermoplastic resin) contained in the coating material must be used in the form of emulsion particles. By using the emulsion particles, the fine particles of metal oxide having a very small size can be point-bound. As compared with the case of using a solvent soluble type binder in the same amount, the emulsion particles tend to have a great binding force. Accordingly, the fine particles of metal oxide can be bound by a small amount of binder in the case of using the emulsion particles as the binder.

In the present invention, the thermoplastic resin is used in the condition of aqueous emulsion. Examples of the emulsion of polyolefin resin include various kinds of emulsions in Arrow Base (registered trademark) series of Unitika Limited and HARDLEN (registered trademark) series of TOYOBO CO., LTD.

Examples of the emulsion of polyamide resin include Model M3-C-22-25 (effective component concentration: 25 mass %), M4-C-X025 (effective component concentration: 25 mass %), MC-2220 (effective component concentration: 20 mass %), MA-X020 (effective component concentration: 20 mass %), MD-X020 (effective component concentration: 20 mass %), ME-X025 (effective component concentration: 25 mass %), and ME-X020 (effective component concentration: 20 mass %) of Unitika Limited. These emulsions may be used solely or in combination.

The coating material to be used for the formation of the functional layer may further contain an additive component such as a leveling agent, ultraviolet absorber, and antioxidant as required, as long as it does not impair the effects of the present invention. The coating material to be used for the formation of the functional layer contains a composition as a solid content, which is composed of the fine particles of metal oxide: 10 to 90 mass %, the emulsion particles of thermoplastic resin: 10 to 90 mass %, and the additive component: 0 to 10 mass %, totally 100 mass %.

<Dispersing Medium>

The dispersing medium contained in the coating material is preferably selected from an aqueous medium from the viewpoints of environment and safety. The aqueous medium means water or a mixed medium of water and water-soluble organic solvent. Examples of the water-soluble organic solvent include N-methyl-2-pyrrolidone (NMP), N,N-dimethyl formamide, tetrahydrofuran, dimethyl acetamide, dimethyl sulfoxide, hexamethyl sulforamide, tetramethyl urea, acetone, methyl ethyl ketone (MEK), γ-butyro lactone, and isopropanol.

<Coating Material>

The coating material to be used for the formation of the functional layer may be obtained by compounding the fine particles of metal oxide and the binder or further compounding the additive component as required, and then mixing and dispersing these components in the dispersing medium. Means for mixing and dispersing these components is not especially limited, but any known mixing apparatus such as a homogenizer, dissolver, and planetary mixer. The ratio of the total solid content composed of the fine particles of metal oxide, the binder, and the additive component to the total amount of the coating material is preferably set to 3 to 20 mass %, more preferably 5 to 15 mass %.

The coating material may be applied to the back side of the base film and then dried by any method known in the art, thereby forming the functional layer. Examples of the method of applying the coating material include bar coating, air knife coating, gravure coating, gravure reverse coating, reverse roll coating, lip coating, die coating, dip coating, offset printing, flexographic printing, and screen printing.

<Thickness of the Functional Layer>

The thickness of the functional layer is not especially limited. For example, the thickness of the functional layer is set to a value greater than or equal to 0.5 μm, preferably 1 μm and less than or equal to 10 μm, preferably 3 μm, more preferably 2 μm. By setting the thickness of the functional layer in this range, adhering of the base film to a chuck table or the like due to melting can be prevented more effectively. If the thickness of the functional layer is too large (e.g., greater than 10 μm), cracks are prone to generate in the functional layer.

For example, the surface roughness of the exposed surface of the functional layer opposite to the base film is set to a value greater than or equal to 0.2 μm, preferably 0.3 μm and less than or equal to 1.5 μm, preferably 1.0 μm. By adjusting the surface roughness of the exposed surface of the functional layer to this range, adhering of the base film to a chuck table or the like due to melting can be prevented more effectively.

The surface roughness mentioned above means an arithmetic mean roughness (Ra) defined in JIS B0601. For example, the arithmetic mean roughness (Ra) may be measured by using a probe type surface roughness measuring apparatus (SURFCOM 1500SD2-3DF, tradename of TOKYO SEIMITSU CO., LTD.).

(Base Film of the Adhesive Tape)

The base film may be formed from a polymer sheet of any polymer such as acrylic resin, polyurethane resin, polynorbornene resin, polyalkylene glycol resin, polyolefin resin (polystyrene resin, polyethylene resin, etc.), polyimide resin, polyester resin, epoxy resin, polyamide resin, polycarbonate resin, silicone resin, and fluororesin; a metal sheet of any metal such as copper, aluminum, and stainless steel; a nonwoven fabric of any polymer fiber such as PP, PVC, PE, PU, PS, PO, and PET, any synthetic fiber such as rayon and cellulose acetate, any natural fiber such as cotton, silk, and wool, or any inorganic fiber such as glass fiber and carbon fiber; a sheet having a physical or optical function imparted by drawing, impregnation, etc. of these materials; or a sheet containing a rubber component such as diene rubber (styrene-butadiene copolymer rubber, butadiene rubber, etc.), non-diene rubber (isobutylene-isoprene rubber, chlorinated polyethylene rubber, urethane rubber, etc.), and thermoplastic rubber (thermoplastic elastomer). These materials may be used solely or in combination.

In particular, as described later, the material of the base film is preferably selected so that the base film is resistant to cutting by the laser light for cutting the plate-shaped workpiece (wafer), in consideration of at least one kind of property, two or more kinds of properties, or preferably all kinds of properties including light transmittance, stacked condition, breaking extension, absorption coefficient, melting point, thickness, breaking strength, specific heat, etching rate, Tg, heat deformation temperature, and specific gravity.

The thickness of the base film is preferably set to a value greater than or equal to 50 μm, more preferably 100 μm, further more preferably 150 μm, and further preferably set in the range of 50 to 500 μm. By setting the thickness of the base film as mentioned above, operability and workability can be ensured in various steps such as attaching of the base film to the semiconductor wafer, cutting of the semiconductor wafer, and peeling of the base film from the semiconductor chips.

In the applicable thickness range of the base film, the transmittance of laser light, in particular, laser light having a wavelength of about 355 nm to about 600 nm, is set to a value greater than or equal to about 50%, preferably about 55%, more preferably about 60%, further more preferably 65%. The light transmittance may be measured by using an ultraviolet-visible spectrophotometer, for example. By setting the light transmittance as mentioned above, deterioration of the base film itself by the laser light can be prevented. The light transmittance of the base film means a value measured in the condition where the functional layer is absent.

(Adhesive Layer of the Adhesive Tape)

The adhesive layer formed on the front side of the base film is not especially limited, but it may be formed by any adhesive composition known in the art, this adhesive composition containing an energy ray curable resin which is curable by radiation such as ultraviolet radiation and electron beam, a thermosetting resin, and a thermoplastic resin, for example. In particular, the energy ray curable resin is preferably used, so as to improve the peelability of the workpiece.

By applying an energy ray to the adhesive layer containing the energy ray curable resin, a three-dimensional network structure is formed in the adhesive layer to cause a reduction in adhesive strength, so that the workpiece can be easily peeled from the adhesive tape after processing. The adhesive composition to be used for the formation of the adhesive layer is not limited. Examples of the adhesive composition usable in the present invention are described in Japanese Patent Laid-open Nos. 2002-203816, 2003-142433, 2005-19607, 2005-279698, 2006-35277, and 2006-111659.

More specifically, the adhesive composition may contain a rubber such as natural rubber and various synthetic rubbers, or an acrylic polymer such as polyalkyl (meth)acrylate produced by the polymerization of acrylonitrile and alkyl acrylate or alkyl methacrylate having a normal or iso alkyl group having about 1 to 20 carbon atoms.

The adhesive layer formed on the front side of the base film may be formed by any method known in the art. For example, the adhesive composition mentioned above is prepared and next applied to the base film. Thereafter, the coating film is dried to thereby form the adhesive layer. Examples of the method of applying the adhesive composition include bar coating, air knife coating, gravure coating, gravure reverse coating, reverse roll coating, lip coating, die coating, dip coating, offset printing, flexographic printing, and screen printing. As another method, the adhesive layer may be first formed on a release liner and the release liner may be next attached to the base film.

EXAMPLES

Various examples according to this preferred embodiment will now be described in detail. In the following description, "parts" and "%" are those by weight unless otherwise specified. In Examples, the following materials were used as fine particles A and B and resins C to E.

[Fine particles A] Colloidal silica (Snow Tex ST-C: NISSAN CHEMICAL INDUSTRIES, LTD., silica fine particles dispersion (silica sol), solid content: 20%, average particle size of primary particles: 10 to 15 nm)

[Fine particles B] Zirconia (Nano Use ZR-30BFN: NISSAN CHEMICAL INDUSTRIES, LTD., zirconia fine particles dispersion (zirconia sol), solid content: 30%, average particle size of primary particles: 10 to 30 nm)

[Resin C] Modified polyolefin resin (Arrow Base TC4010: Unitika Limited, acid modified polyolefin resin (PP skeleton) aqueous dispersion, effective component concentration: 25%, acid modified amount: 5 mass % or less, melting point: 130 to 150° C., no emulsifier contained)

[Resin D] Polyamide resin (ME-X025: Unitika Limited, polyamide resin aqueous dispersion, effective component concentration: 25%, melting point: 150 to 160° C.)

[Resin E] Polyester resin (Vylon GK880: TOYOBO CO., LTD., solvent soluble type, effective component concentration: 100%, melting point: 84° C., weight-average molecular weight: 18000)

(Preparation of the Adhesive Tape)

A coating liquid for the adhesive layer with the composition shown below was applied to one side of a polyethylene film having a thickness of 160 µm as the base film by a bar coating method so that the thickness of the adhesive layer after drying became 25 µm. Thereafter, the coating liquid applied was dried to form the adhesive layer. Thereafter, a coating liquid for the functional layer with the composition shown below was applied to the other side of the polyethylene film by a bar coating method so that the thickness of the functional layer after drying became 1.5 µm. Thereafter, the coating liquid applied was dried to form the functional layer. In this manner, the adhesive tape was prepared.

<Composition of the Coating Liquid for the Adhesive Layer>

Acrylic pressure-sensitive adhesive: 100 parts
(Corponiel N4823: The Nippon Synthetic Chemical Industry Co., Ltd.)
Isocyanate compound: 0.44 parts
(Coronate L45E: Nippon Polyurethane Industry Co., Ltd.)
Diluting solvent: 54 parts <Composition of the Coating Liquid for the Functional Layer>

Fine particles of metal oxide: kinds and compounding ratios shown in Table 1
Thermoplastic resin: kinds and compounding ratios shown in Table 1
Solvent: kinds and compounding ratios shown in Table 1

TABLE 1

| | Coating liquid for functional layer (parts by weight) | | | | | | | | | |
|---|---|---|---|---|---|---|---|---|---|---|
| | Fine particles of metal oxide (parts) | | | | | | | | | |
| Example | | | Primary particle | Thermoplastic resin (parts) | | | | Solvent (parts) | | |
| Nos. | A | B | size (nm) | C | D | E | Form | IPA | Water | MEK | Toluene |
| 1 | 29.3 | — | 10-15 | 16 | — | — | Emulsion | 25 | 30 | — | — |
| 2 | 24.4 | — | 10-15 | 20 | — | — | | 25 | 30 | — | — |
| 3 | 19.5 | — | 10-15 | 24 | — | — | | 25 | 30 | — | — |
| 4 | — | 16.7 | 10-30 | 20 | — | — | | 25 | 38 | — | — |
| 5 | 29.3 | — | 10-15 | — | 16 | — | | 25 | 30 | — | — |
| 6 | 24.4 | — | 10-15 | — | 20 | — | | 25 | 30 | — | — |
| 7 | 19.5 | — | 10-15 | — | 24 | — | | 25 | 30 | — | — |
| 8 | — | 16.7 | 10-30 | — | 20 | — | | 25 | 38 | — | — |
| 9 | 24.4 | — | 10-15 | — | — | 5 | Solution | — | — | 35 | 35 |
| 10 | — | 16.7 | 10-30 | — | — | 5 | | — | — | 39 | 39 |

Figure 4:
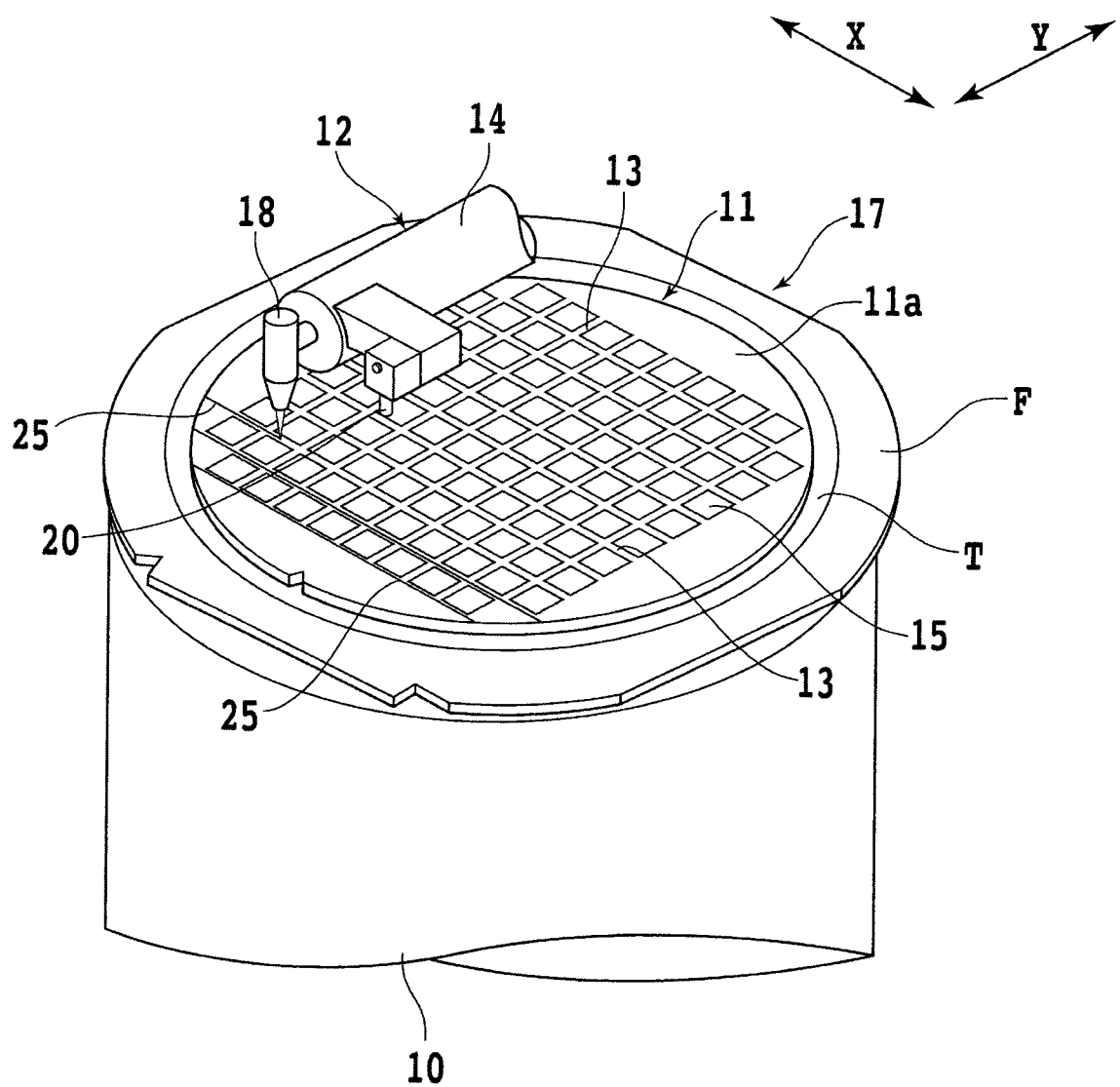
FIG. 4 is a perspective view for illustrating a laser processed groove forming step.

After performing a supporting step of supporting the wafer 11 through the adhesive tape T to the annular frame F, a holding step is performed in such a manner that the wafer unit 17 is placed on a chuck table 10 of a laser processing apparatus as shown in FIG. 4, and the wafer 11 is held through the adhesive tape T on the chuck table 10 under suction.

The laser processing apparatus includes laser beam applying unit 12, which is composed of a housing 14, a laser beam generating unit 16 (see FIG. 5) provided in the housing 14, and focusing means (laser processing head) 18 mounted on the front end of the housing 14. The laser processing apparatus further includes an imaging unit 20 having a microscope, an ordinary imaging device, and an infrared imaging device.

Figure 5:
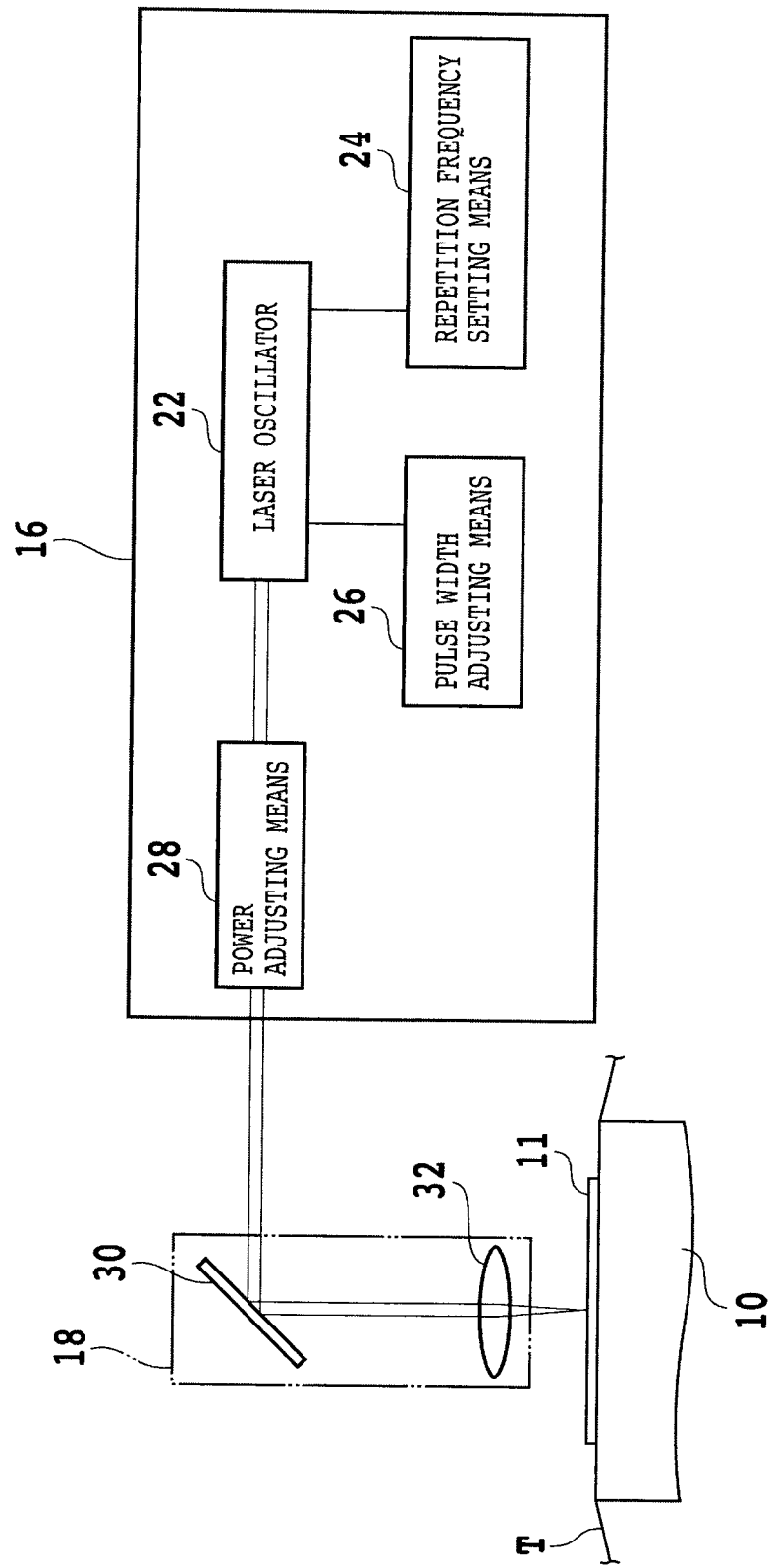
FIG. 5 is a block diagram of a laser beam generating unit.

As shown in FIG. 5, the laser beam generating unit 16 includes a laser oscillator 22 for oscillating YAG laser or YVO4 laser, repetition frequency setting means 24, pulse width adjusting means 26, and power adjusting means 28. The power of a pulsed laser beam generated from the laser oscillator 22 is adjusted to a predetermined power by the power adjusting means 28 of the laser beam generating unit 16. Thereafter, the pulsed laser beam is reflected by a mirror 30 included in the focusing means 18 mounted on the front end of the housing 14, and next focused by a focusing objective lens 32 included in the focusing means 18. The pulsed laser beam focused is applied to the wafer 11 held on the chuck table 10.

After holding the wafer 11 on the chuck table 10 under suction as shown in FIG. 4, an alignment operation is performed in such a manner that the wafer 11 is imaged by the imaging unit 20 to detect the division lines 13 to be laser-processed. This alignment operation is performed by using a technique of pattern matching well known in the art.

After performing the alignment operation, a laser processed groove forming step is performed in such a manner that a pulsed laser beam having an absorption wavelength to the wafer 11 is applied from the focusing means 18 to the front side 11a of the wafer 11 along each division line 13 to thereby form a laser processed groove 25 along each division line 13 by ablation. Preferably, the chuck table 10 is reciprocated in the X direction and the laser beam is applied along the same division line 13 plural times, thereby forming the laser processed groove 25 until the bottom of the laser processed groove 25 reaches the adhesive tape T. Accordingly, the wafer 11 is fully cut by the laser processed groove 25.

After forming the laser processed groove 25 along a predetermined one of the division lines 13 extending in a first direction on the wafer 11, the chuck table 10 is indexed sequentially in the Y direction and the ablation is similarly performed along all of the other division lines 13 extending in the first direction to thereby form a similar laser processed groove 25 along each division line 13 extending in the first direction. Thereafter, the chuck table 10 is rotated 90 degrees to similarly perform the ablation along all of the other division lines 13 extending in a second direction perpendicular to the first direction, thereby forming a similar laser processed groove 25 along each division line 13 extending in the second direction. Preferably, the laser beam is applied plural times along each of all the division lines 13 to form the laser processed groove 25 until the bottom of the laser processed groove 25 reaches the adhesive tape T.

For example, the laser processed groove forming step mentioned above is performed under the following processing conditions.

Light source: YVO4 pulsed laser
Wavelength: 355 nm (third harmonic of YVO4 pulsed laser)
Repetition frequency: 100 kHz
Pulse width: 50 ns
Focused spot diameter: ellipse (major axis: 100 μm; minor axis: 10 μm)
Work feed speed: 100 mm/second
Number of passes: 6 passes/line for full cutting of the wafer After fully cutting the wafer 11 along each division line 13 under the above laser processing conditions, the uncut condition of the adhesive tape T and the adhesion-proof property of the adhesive tape T to the chuck table 10 were evaluated on the following criteria. The results of this evaluation are shown in Table 2.

TABLE 2

| Example Nos. | Ra of the functional layer (μm) | Evaluation Uncut condition | Adhesion-proof property |
|---|---|---|---|
| 1 | 0.7 | a | B |
| 2 | 0.5 | a | A |
| 3 | 0.7 | a | B |
| 4 | 0.4 | a | C |
| 5 | 0.4 | a | C |
| 6 | 0.7 | a | B |
| 7 | 0.4 | a | C |
| 8 | 0.4 | a | C |
| 9 | 0.1 | a | D |
| 10 | 0.1 | a | D |

In Table 2, various alphabets in the evaluation of the uncut condition and the evaluation of the adhesion-proof property have the following meanings.

Uncut Condition
a: The base film of the adhesive tape was not fully cut (excellent).
b: The base film of the adhesive tape was fully cut (poor).

Adhesion-proof Property
A: No adhesion of the adhesive tape to the chuck table occurred and the adhesive tape could be lifted from the chuck table without resistance (very excellent).
B: About 3% of the total area of the adhesive tape adhered to the chuck table, but the adhesive tape could be lifted from the chuck table (excellent).
C: About 5% of the total area of the adhesive tape adhered to the chuck table, but the adhesive tape could be lifted from the chuck table (good).
D: All (100%) of the total area of the adhesive tape adhered to the chuck table, so that the adhesive tape could not be lifted from the chuck table (poor).

As apparent from Table 1 and Table 2, in the case that the thermoplastic resin in the coating liquid for the functional layer is in the form of emulsion (Examples 1 to 8), it was confirmed that all of the functional layers formed by using the coating liquids were useful. Particularly in the case that the compounding ratio (in terms of solid content) between the fine particles of metal oxide and the thermoplastic resin in the coating liquid was 55 mass % for the fine particles of metal oxide and 45 mass % for the thermoplastic resin and that acid modified polyolefin resin was used as the thermoplastic resin (Example 2), it was confirmed that the functional layer formed was most effective.

In the laser processing method according to this preferred embodiment, the adhesive tape T is composed of the base film 19, the adhesive layer 21 formed on one side of the base film 19, and the functional layer 23 formed on the other side of the base film 19, the functional layer 23 including the fine particles of metal oxide, the emulsion particles of thermoplastic resin as a binder, and the dispersing medium. In performing the laser processing, the wafer 11 is attached to the adhesive tape T and the wafer 11 is held on the chuck table 10 in the condition where the functional layer 23 of the adhesive tape T is in contact with the upper surface of the chuck table 10. Accordingly, even when the laser beam is applied to the adhesive tape T, melting of the adhesive tape T can be suppressed by the functional layer 23, so that adhering of the adhesive tape T to the chuck table 10 can be prevented.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method for forming a laser processed groove on a plate-shaped workpiece by using a laser processing apparatus including a chuck table for holding said plate-shaped workpiece, laser beam applying means for applying a laser beam to said plate-shaped workpiece held on said chuck table, and feeding means for relatively feeding said chuck table and said laser beam applying means, said laser processing method comprising:
a supporting step of attaching an adhesive tape to an annular frame having an opening for accommodating said plate-shaped workpiece and attaching said plate-shaped workpiece to said adhesive tape in a condition where said plate-shaped workpiece is positioned in said opening of said annular frame, thereby supporting said plate-shaped workpiece through said adhesive tape to said annular frame, said adhesive tape being composed of a base film, an adhesive layer formed on one side of said base film, and a functional layer formed on the other side of said base film, said functional layer including fine particles of metal oxide, emulsion particles of thermoplastic resin as a binder, and a dispersing medium;
a holding step of holding said plate-shaped workpiece on said chuck table in a condition where said functional layer of said adhesive tape attached to said plate-shaped workpiece is in contact with said chuck table, after performing said supporting step, wherein the surface roughness of a surface of said functional layer that is in contact with said chuck table during said holding step is greater than or equal to 0.2 μm and less than or equal to 1.5 μm; and
a laser processed groove forming step of applying said laser beam from said laser beam applying means to said plate-shaped workpiece held on said chuck table and relatively feeding said chuck table and said laser beam applying means by operating said feeding means, after performing said holding step, thereby forming said laser processed groove on said plate-shaped workpiece,
wherein said functional layer prevents adhering of the base film to the chuck table during said laser processed groove forming step.

2. The laser processing method according to claim 1, wherein said laser beam to be applied from said laser beam applying means has a wavelength of 300 to 400 nm.

3. The laser processing method according to claim 1, wherein said laser processed groove has a depth reaching said adhesive tape.

4. The laser processing method according to claim 1, wherein the average particle size of said fine particles of metal oxide is greater than or equal to 10 nm and less than or equal to 250 nm.

5. The laser processing method according to claim 1, wherein the average particle size of said fine particles of metal oxide is greater than or equal to 10 nm and less than or equal to 50 nm.

6. The laser processing method according to claim 1, wherein said fine particles of metal oxide comprise colloidal silica.

7. The laser processing method according to claim 1, wherein said fine particles of metal oxide comprise colloidal silica surface treated with aluminum.

8. The laser processing method according to claim 1, wherein said fine particles of metal oxide comprise colloidal alumina.

9. The laser processing method according to claim 1, wherein said fine particles of metal oxide comprise phosphorus doped tin oxide water dispersed sol.

10. The laser processing method according to claim 1, wherein said fine particles of metal oxide comprise minute colloidal zirconia aqueous sol.

11. The laser processing method according to claim 1, wherein said thermoplastic resin comprises a polyamide resin.

12. The laser processing method according to claim 1, wherein said thermoplastic resin comprises a polyester resin.

13. The laser processing method according to claim 1, wherein said thermoplastic resin comprises an ethylene-α-olefin copolymer, wherein said α-olefin comprises an unsaturated hydrocarbon compounds containing between 3 and 20 carbon atoms.

14. The laser processing method according to claim 1, wherein said thermoplastic resin comprises a propylene-α-olefin copolymer, wherein said α-olefin comprises an unsaturated hydrocarbon compounds containing between 3 and 20 carbon atoms.

15. The laser processing method according to claim 1, wherein said emulsion particles of thermoplastic resin comprise an aqueous emulsion.

16. The laser processing method according to claim 1, wherein the thickness of said functional layer is between 0.5 μm and 10 μm.

17. The laser processing method according to claim 1, wherein the thickness of said functional layer is between 1 μm and 2 μm.

18. The laser processing method according to claim 1, wherein the dispersing medium comprises a mixed medium of water and water-soluble organic solvent, wherein the water-soluble organic solvent is selected from the group consisting of: N-methyl-2-pyrrolidone (NMP), N,N-dimethyl formamide, tetrahydro furan, dimethyl acetamide, dimethyl sulfoxide, hexamethyl sulforamide, tetramethyl urea, acetone, methyl ethyl ketone (MEK), γ-butyro lactone, or isopropanol.

19. The laser processing method according to claim 1, wherein the average particle size of said fine particles of metal oxide is greater than or equal to 5 nm and less than or equal to 400 nm.

* * * * *